United States Patent [19]

Tsukii et al.

[11] Patent Number: 5,023,494

[45] Date of Patent: Jun. 11, 1991

[54] HIGH ISOLATION PASSIVE SWITCH

[75] Inventors: Toshikazu Tsukii, Santa Barbara; S. Gene Houng; Michael D. Miller, both of Goleta; Sherwood A. McOwen, Jr., Santa Barbara, all of Calif.

[73] Assignee: Raytheon Company, Lexington, Mass.

[21] Appl. No.: 424,773

[22] Filed: Oct. 20, 1989

[51] Int. Cl.[5] .................... H03K 3/013; H03K 17/08; H03K 17/687; H01P 1/15

[52] U.S. Cl. ................................ 307/571; 307/303.2; 307/482.1; 307/542; 307/594; 307/596; 333/262

[58] Field of Search .................... 307/570, 571, 303.2, 307/482.1, 443, 542, 594, 596, 448, 473; 333/262

[56] References Cited

U.S. PATENT DOCUMENTS 4,939,485 7/1990 Eisenberg .......................... 333/262

OTHER PUBLICATIONS

M. J. Reid, "Microwave Switch and Attenuator Modules," Microwave Journal, Jul. 1973, pp. 145-148.

"Pin Diode Switch Basics," Technical Feature from MSN, Jun. 1989, p. 41.

"Non-Reflective and Reflective SPDT Switches with Integral Drivers," Alpha Industries, Inc. Technical Specification, pp. 9-12.

*Primary Examiner*—Stanley D. Miller

*Assistant Examiner*—David R. Bertelson

*Attorney, Agent, or Firm*—Denis G. Maloney; Richard M. Sharkansky

[57] ABSTRACT

A radio frequency switch disposed over a substrate having ground plane conductors disposed over an opposite surface thereof is described. The switch has at least two terminals, and includes a plurality of pairs of transistors, each one of said transistors coupled between a reference potential and a common transmission line which is coupled to one of the pair of terminals. A pair of topside conductors are disposed over the substrate to couple the transistors through plated vias to a bottom ground plane conductor. The switch further includes a series connected transistor disposed between the r.f. line and a second one of the terminals of the circuit.

9 Claims, 6 Drawing Sheets

HIGH ISOLATION PASSIVE SWITCH

BACKGROUND OF THE INVENTION

This invention relates generally to radio frequency circuits and more particularly to radio frequency switching circuits.

As is known in the art, radio frequency switches have many applications in radio frequency systems. One type of switching circuit well known in the art uses PIN diodes as passive switching elements. An example of such a switch, using PIN diodes, is described in a paper entitled "Microwave Switch and Attenuator Modules" by Reid, Microwave Journal, July 1973, pp. 145-148. PIN diode switches offer the advantages of moderate switching speeds, (i.e. of the order of tens of nanoseconds) and relatively good isolation generally exceeding 35 db over a relatively large frequency band. Nevertheless, several drawbacks exist with PIN diode switches. In particular, one drawback is that the PIN diode is not readily integrated with monolithic microwave integrated circuits. Many future radio frequency system requirements will specify monolithic microwave integrated circuits to reduce system size and cost while increasing system performance levels and reliability. Moreover, many system applications require faster switching speeds, generally less than 5 nanoseconds.

One solution to the problems of miniaturization and faster switching speeds is to provide passive switches based upon metal semiconductor field effect transistors (MESFETs). Such switches use field effect transistors, as passive elements, thus operating without output or drain circuit bias. These transistors are coupled in asymmetric series and shunt combinations to provide a particular switching circuit. One problem with this approach, however, is that heretofore relatively poor isolation has been provided by such switches. In general, isolation levels have been limited to less than about 35 dB over a frequency range of 2-18 GHZ. While such isolation may be tolerable for certain applications, in other applications, such as in electronic countermeasures less than 35 db isolation is inadequate. Often isolation levels exceeding 35 db are required. Thus, in those applications requiring a high degree of isolation, the PIN diode approach mentioned above, has been used. It would be desirable, nevertheless, to provide a FET based switch, which has a relatively high isolation and thus which can be integrated in a monolithic microwave integrated circuit.

SUMMARY OF THE INVENTION

In accordance with the present invention, a radio frequency switch, having at least two terminals, includes at least one pair of transistors, each one of said transistors having a control electrode and first and second electrodes. Each one of the control electrodes is fed by a first control signal for selectively controlling the conductivity of the transistor between the first and second electrodes. The switch further includes a radio frequency propagation line having a first end coupled to one of the terminals of the switch. One of said first and second electrodes of each one of the first and second transistors is connected to the propagation line. The switch further includes a third transistor having a control electrode and first and second electrodes. The control electrode of the third transistor is fed by a second control signal for controlling the conductivity between said first and second electrodes. A first one of said first and second electrodes of the third transistor is coupled to a second end of the radio frequency propagation line and a second one of said first and second electrodes of the third transistor is coupled to a second terminal of the switch. The switch further includes means for coupling a second one of each of said first and second electrodes of the pair of transistors to a reference potential. With this particular arrangement, an RF switch is provided having a relatively high isolation between the pair of terminals in an "off" state of the switch. By using a pair of symmetric, shunt mounted FETs, impedance discontinuities, which may provide undesired radiation of r.f. energy, are reduced.

In accordance with a further aspect of the invention, the means for connecting the electrodes to the reference potential includes a pair of conductors disposed on a surface of a substrate which surface that supports the transistors and the radio frequency propagation line. Each shunt mounted transistor has its reference electrode connected to a reference potential via one of the pair of conductors. Each of the conductors is coupled to a ground plane conductor disposed over an opposite surface of the substrate by plated vias disposed between said conductor and the ground plane. With this particular arrangement, the radio frequency propagation line is confined in a channel provided by the pair of general conductors. Such conductors provide topside grounding of the electrodes of the transistors, and aid in suppressing undesired parasitic coupling, radiation, and surface propagations in the switch, thus providing a switch having a relatively high degree of isolation.

In accordance with a still further aspect of the present invention, external r.f. connections and preferrable bias connections are made to said r.f. switch by channelled conductors. As an example of such an arrangement, a channelled radio frequency package includes a base comprising a conductive material, having disposed therein a plurality of recessed channels. One portion of said recessed channels has control lines disposed therein, to couple control signals to the radio frequency switch. A second other portion of said recessed channels have microstrip transmission lines disposed therein to interconnect r.f. signal terminals of said switch to external connectors disposed or provided on the package. By providing relatively deep, isolated channels to interconnect the switch to external circuits, parasitic coupling of r.f. signals is minimized, thus maintaining the relatively high isolation of the switch.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
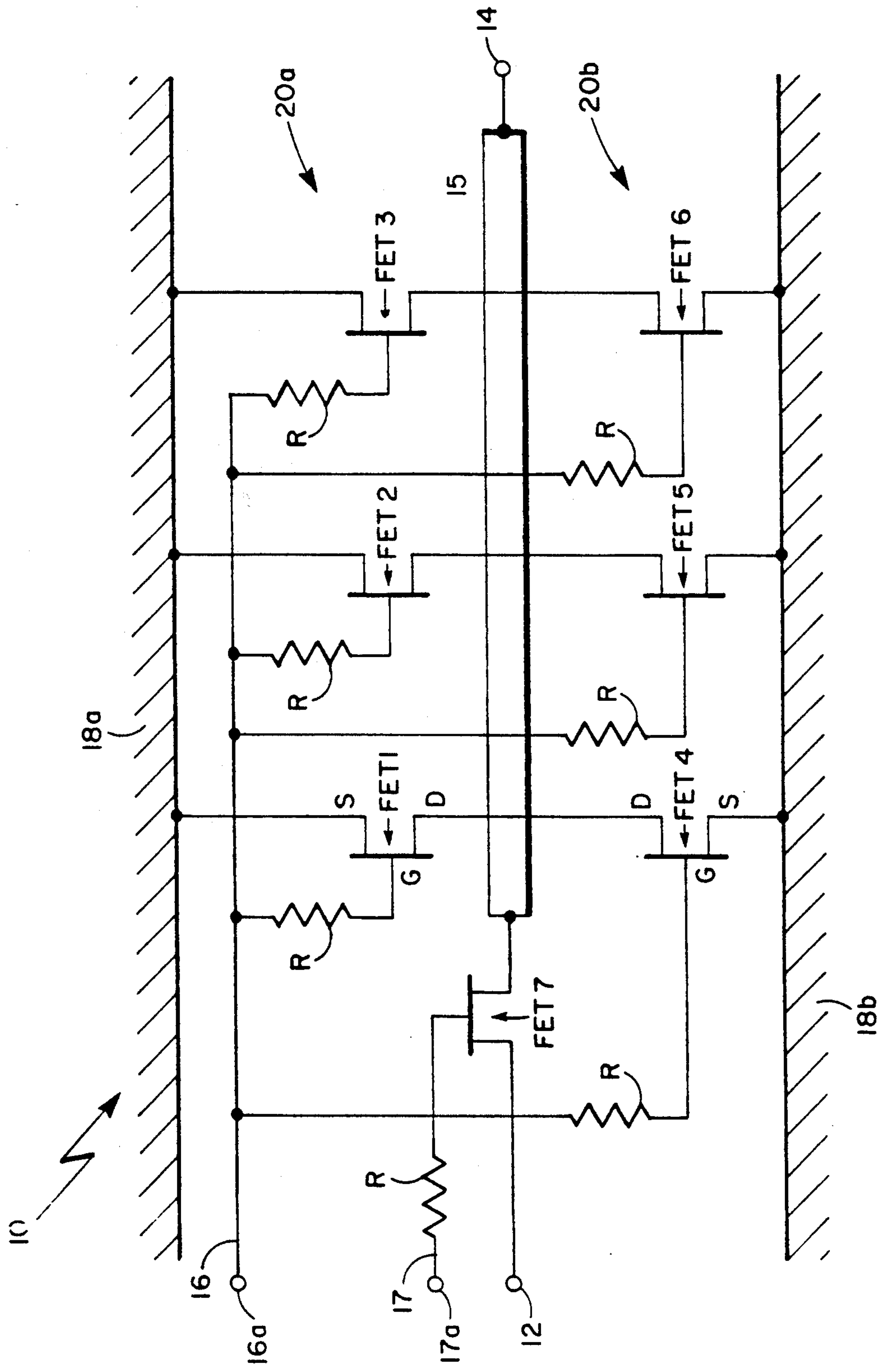
FIG. 1 is a schematic representation of a single-pole/-single-throw switch in accordance with the present invention.

Referring now to FIG. 1, a radio frequency switch, here a single-pole/single-throw switch 10, is shown to include a first set 20*a* or plurality of field effect transistors FET 1–FET 3, each transistor having a gate electrode, a source electrode, and a drain electrode. Here, said transistors are metal semiconductor field effect transistors (MESFETS) as will be further described in conjunction with FIGS. 2 and 2A. Other transistors may alternatively be used however.

The switch 10 is shown to further include a second set 20*b* or plurality of transistors, here FET 4–FET 6, each having a gate electrode, a source electrode, and a drain electrode and here each being a MESFET as described above. Here said transistors FET 1–FET 3 have there source electrodes (S) coupled to a common reference potential, here ground, via a conductor 18*a*. Likewise, the source electrodes (S) of transistors FET 4–FET 6 are coupled to the reference potential, here via a second conductor 18*b*, as shown. The switch 10, is shown to further include a propagation network 15, here, said propagation network 15 being a microstrip transmission line. The propagation network 15 has one end thereof coupled to a signal terminal 14 of switch 10 and has a second end thereof coupled to a transistor, here FET 7. Transistor FET 7 also has a control or gate electrode G, a source electrode and a drain electrode. Source and drain electrodes are connected between a second terminal 12 of switch 10 and the propagation network 15. Gate or control electrodes (G) of each one of the transistors FET 1–FET 3 and FET 4–FET 5 are coupled via a common conductor 16 and pull-up resistors (R) to a first control terminal 16*a*, as also shown. Gate electrode (G) of transistor FET 7 is coupled via a conductor 17 and pull-up resistor (R) to a second control terminal 17*a*.

For broadband applications, it is desirable to provide a plurality of pairs of transistors in each one of said sets 20*a*, 20*b*, as shown. Successive ones of said transistors are coupled by the propagation line 15, and have a spacing and impedance, which together with the impedance of the transistors between source and drain electrodes provides a network having a predetermined characteristic impedance. Thus, the inherent reactance of the transistors are taken into consideration when designing the switch to provide broadband performance. For a nonsymmetric case general broadband matching techniques are described in U.S. Pat. No. 4,456,888 by Ayasli, assigned to the assignee of the present invention, and incorporated herein by reference. The switch, however, would be operable with a single field effect transistor disposed in each one of said channels 20*a* and 20*b*.

In the "on" state of the switch 10, a signal fed at terminal 12 is coupled to terminal 14, whereas in the "off" state of the switch 10, a signal fed at terminal 12 is isolated from terminal 14 with relatively high isolation in comparison to prior art approaches using field effect transistors. To provide switch 10, in its "on" state, a control signal is fed to terminal 16*a*, and via a DC path 16 and resistors R, is fed to gate electrodes G of each one of transistors FET 1–FET 6 to place said transistors (FET 1–FET 6) in their high impedance state or "off" state between source and drain electrodes. An opposite state of a second control signal is fed to terminal 17*a* and fed via line 17 and resistor R to the gate electrode G of transistor FET 7 to place FET 7 in a relatively low impedance state or "on" state between source and drain electrodes thereof. Thus, an r.f. signal fed to terminal 12 is coupled to terminal 14 with relatively low loss along said path. To place the switch 10 in its "off" state, the first control signal is fed to terminal 16*a* having a second opposite state to provide transistors FET 1–FET 6 in a low impedance state or "on" state, to ground portions of the propagation network 15, via a relatively low impedance path between source and drain electrodes of each one of said transistors FET 1–FET 6. Moreover, the second control signal is fed to terminal 17*a*, having a second, opposite state to place transistor FET 7 in a high impedance state, thereby providing an open circuit between terminal 12 and the propagation network 15.

The problem with providing monolithic microwave integrated circuit passive FET based switches having high isolation between input and output terminals is caused by parasitic coupling and radiation, and surface propagation when the circuit is actually built as a MMIC. Typically, a design for such a switch may predict a relatively high isolation between the terminals. However, when such typical designs are reduced to a MMIC actual circuit, the measured isolation is significantly less than that predicted. The cause for this discrepancy between predicted isolation and actual isolation is that the presently available microwave design techniques do not adequately take into consideration unwanted coupling, radiation, and surface propagation, which occurs in an actual circuit. These unwanted effects are present with microstrip circuits, where all discontinuities radiate energy, excite surface waves, and generate higher order modes of propagation in the transmission lines. Moreover, elements in the circuits, such as corners, junctions, open and short circuits, which are frequently encountered in a monolithic microwave integrated circuit switch also provide unintended radiation and wave excitation and thus set practical limits to the isolation that can be achieved by a conventional MMIC switch. In addition to these undesired parasitic effects undesirable r.f. coupling within the circuit further degrades the isolation of the MMIC switch.

The circuit shown in FIG. 1, as well as the implementation as will be described in conjunction with FIG. 2, reduce the loss of isolation by suppressing undesired radiation, wave excitation, and parasitic coupling effects, and thus provides a MESFET passive switch having high isolation between input and output terminals. The symmetric shunt field effect transistor typography, as shown in FIG. 1, minimizes discontinuities in the transmission lines and thus reduces the grounding inductances compared to the conventional asymmetric approach of the prior art. A second improvement in this switch, results from the use of a series field effect transistor, coupled between one of the terminals, here terminal 12, and the propagation network 15. When this transistor FET 7 is placed in its high impedance point or a pinch off condition, improved isolation is also provided to the switch.

Other improvements, to reduce or suppress, these undesired parasitic effects will now be described in conjunction with FIG. 2.

Figure 2:
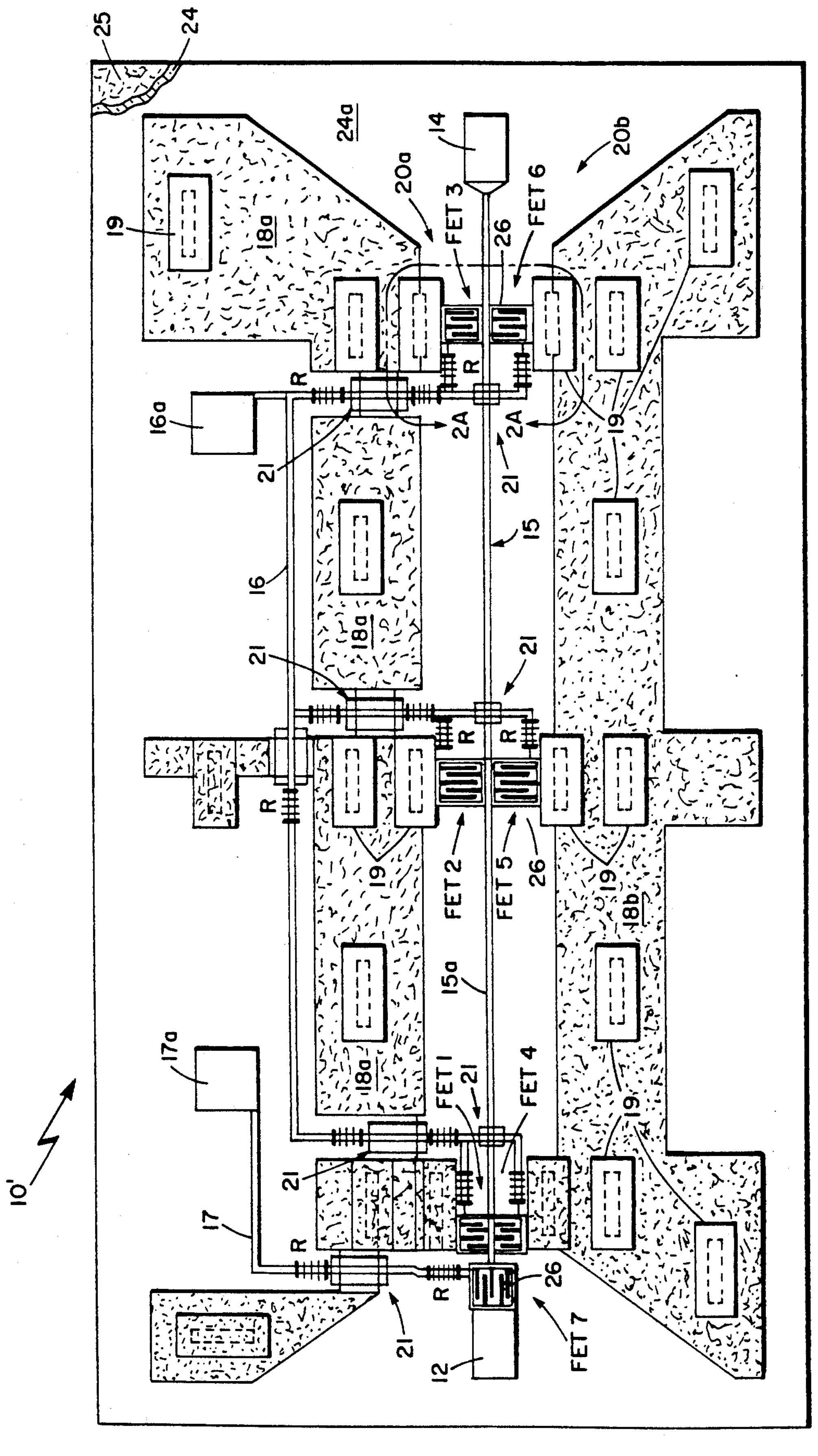
FIG. 2 is a plan view of the switch of FIG. 1 fabricated as a monolithic microwave integrated circuit.

Referring now to FIG. 2, the single-pole/single-throw switch 10 of FIG. 1 is here shown as a monolithic microwave integrated circuit 10'. Like elements of FIG. 1 are referenced with the same reference designations in FIG. 2. The circuit, as shown in FIG. 2, is fabricated on a semi-insulating substrate 24, here of gallium arsenide. Active regions for transistors FET 1–FET 7 are provided over a first surface 24a of substrate 24 and are suitably doped using conventional techniques to provide regions for source, drain, and gate electrodes of the MESFETS as would be known to one of ordinary skill in the art. Any technique such as epitaxial growth or ion implantation may be used to provide active regions 26. As also shown in FIG. 2, pairs of said transistors FET 1, FET 4; FET 2, FET 5; and FET 3, FET 6 are disposed in a symmetric shunt connection as described in conjunction with FIG. 1. Here each of the transistors, FET 1–FET 7, are continuous gate transistors of a type described in conjunction with U.S. patent application, Ser. No. 285,173, filed on Dec. 16, 1988 by Schlinder et al., assigned to assignee of the present invention and incorporated herein by reference.

Figure 2A:
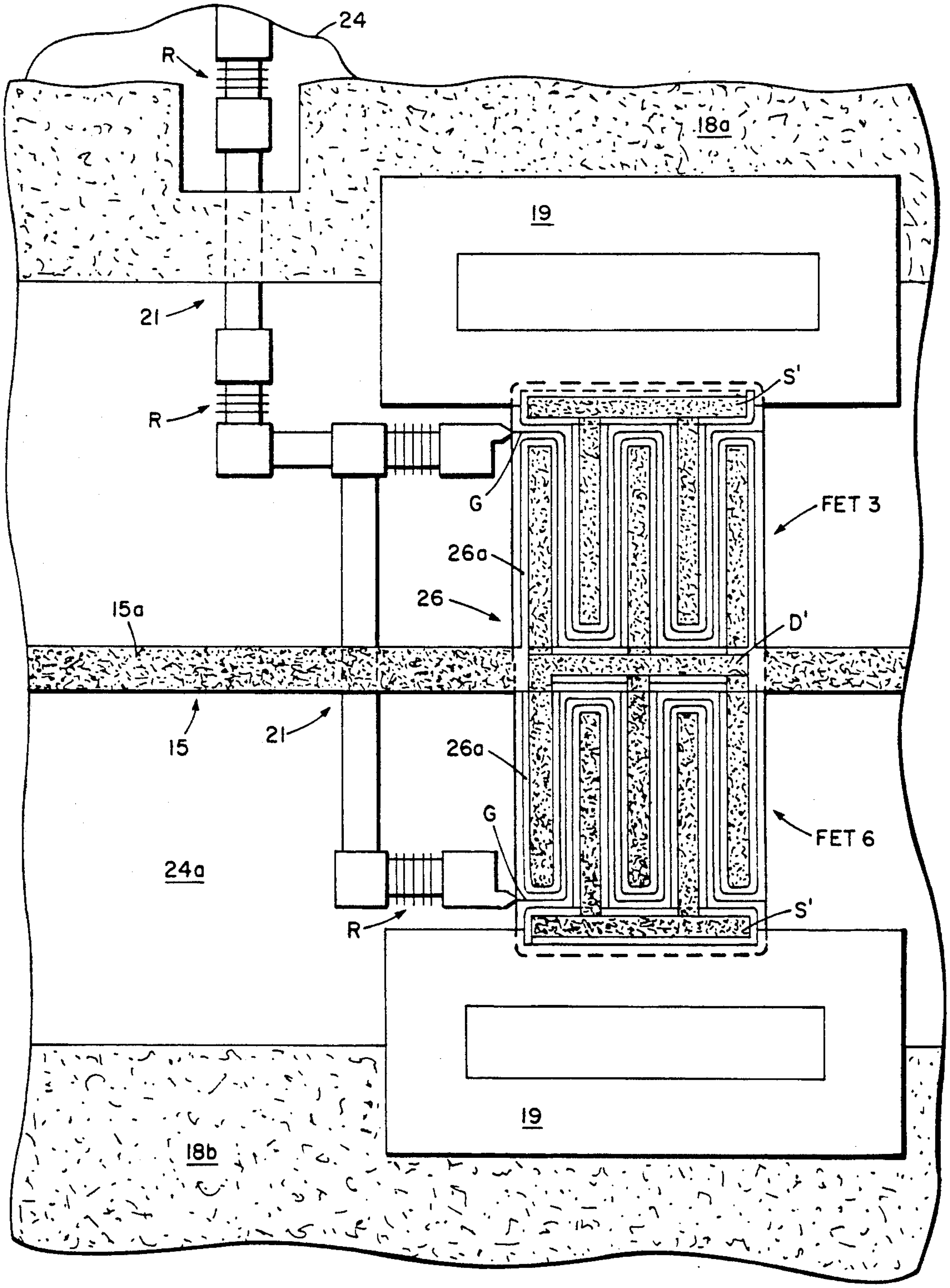
FIG. 2A is an enlarged plan view taken along line 2A—2A of a portion of the switch shown in FIG. 2, enlarged to show details of construction of a pair of shunt coupled FETs in accordance with a further aspect of the invention.

Referring now also to FIG. 2A, as on an exemplary pair of such transistors, here, FET 3, FET 6 are shown having a continuous gate electrode, which separates interdigitated source (S) and drain (D) fingers. Source fingers (S) are coupled to one of a pair of common source electrodes S'. Common source electrode S' of FET 3 is coupled to a plated via 19. Such via 19 is coupled directly to ground plane conductor 25 to provide a relative low inductance path to ground, as well as being connected with topside conductor 18a, as shown. Similarly, source electrode (S') of FET 6 is also coupled to via 19 and topside conductor 18b, as also shown. Additional plated vias 19 are dispersed throughout circuit 10' and are used inter alia to connect the topside ground plane conductors 18a, 18b to the bottom surface ground plane conductor 25. Interdigitated drain fingers D are coupled to a common drain electrode D' disposed on a strip conductor 15a. Strip conductor 15a in combination with the substrate 24 and underlying ground plane conductor 25 forms the microstrip transmission line 15. Resistors R are provided in this circuit by open gate field effect transistors of a type as generally described in conjunction with U.S. Pat. No. 4,543,535, also assigned to the assignee of the present invention. Here an single active region 26 is disposed under both transistors FET 3, FET 6, as well as, the strip conductor 15a of microstrip transmission line 15. Active region 26 has an N-type dopant concentration generally around $1\times10^{16}$ up to $3\times10^{17}$ a/cc of silicon. Contact regions 26a are also provided over 26 having a dopant concentration of about $1\times10^{18}$ a/cc of silicon or higher to form ohmic contact with source and drain fingers. Gate electrode G is disposed in Schottly barrier contact with active region 26.

One feature of the switch 10', as shown in FIG. 2, is the use of conductive areas over the top surface of the substrate 24. These conductors 18a and 18b which are connected to the underlying ground plane conductor 24 by a series of via holes 19, as mentioned above also act as ground plane conductors to help suppress undesired coupling, radiation, and surface propagation. The use of pairs of symmetric shunt FETS, as described in conjunction with FIG. 1, as well as the topside ground plane conductors 18a, 18b provide a confined channel through which energy on the strip conductor 15a (FIG. 2) of microstrip line 15 can propagate and be confined to, thus providing r.f. switch 10' with relative high isolation between terminals 12 and 14 in its "off" state. Areas 21 in FIG. 2 denote conventional air bridge overlays or dielectric crossovers to electrically isolate a pair of crossing conductors.

The circuits shown in FIGS. 1 and 2, thus incorporate several improvements to provide high isolation between terminals 12 and 14 in the off state of the switch 10'. The first improvement is the use of pairs of symmetric shunt connected FETs as described above. The second improvement is the use of a channelized microstrip conductor 15, which is provided by forming ground plane conductors 18a and 18b on the top surface 24a of the substrate 24, as ground plane conductors, which are connected to the underlying ground plane conductor 25 through plated vias 19. The top surface ground planes 18a, 18b suppress surface wave propagations. Moreover, spacing of conductors on the circuit on the order of about three substrate thicknesses or more apart will reduce coupling and thus improve isolation.

Figure 3:
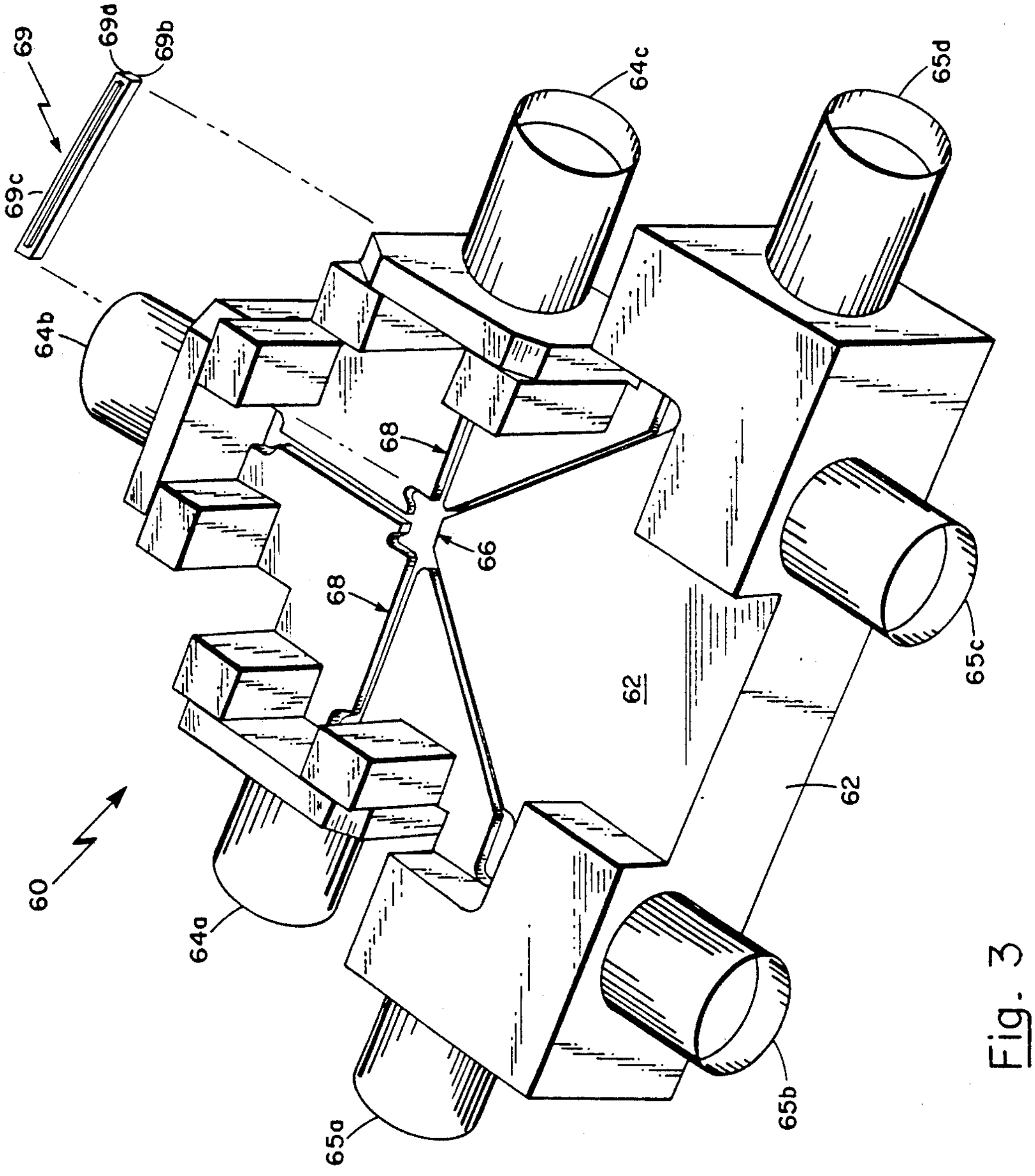
FIG. 3 is an isometric view of a package having recessed channels to receive the isolated external signals fed to and from the switch.

Referring now to FIG. 3, a package 60 particularly adapted for the high isolation RF switch circuit 10', is shown to include a base 62 comprised of a machine metal, such as brass, and preferrably having a coating (not numbered) of a highly conductive metal, such as gold disposed thereon. The package 60 further has disposed thereon conventional coaxial connectors 64a–64c and 65a–65d, and coaxial to microstrip transitions (not shown). The base 62 has disposed therein channels or grooves 68. Here said grooves 68 are relatively deep and are arranged to provide pathways between the coaxial conductors 64a–64c and 65a–65d and a central recess 66, which receives the circuit 10'. The grooves 68 receive microstrip transmission lines to interconnect the circuit 10' to the connectors 64a–64c and 65a–65d. For the circuit of FIG. 2 connectors 64a, 64c are used as r.f. terminals and 65b and 65c may be used as control signal terminals. The grooves 68 and recess 66 in the base 62 of the package 60 further improves or reduces degradation in isolation between connectors 64a, 64c. A microstrip transmission element 69, is inserted into each of grooves 68 and includes a substrate 69a, hereof alumina having a ground plane conductor 69b disposed over a first surface thereof, and a patterned strip conductors, here 69c disposed over a second, opposite surface thereof. Conductive epoxy is used to secure the ground plane of transmission line element 69 into the grooves 68. Such a line element 69 is here used for both r.f. and bias connections.

Figure 4:
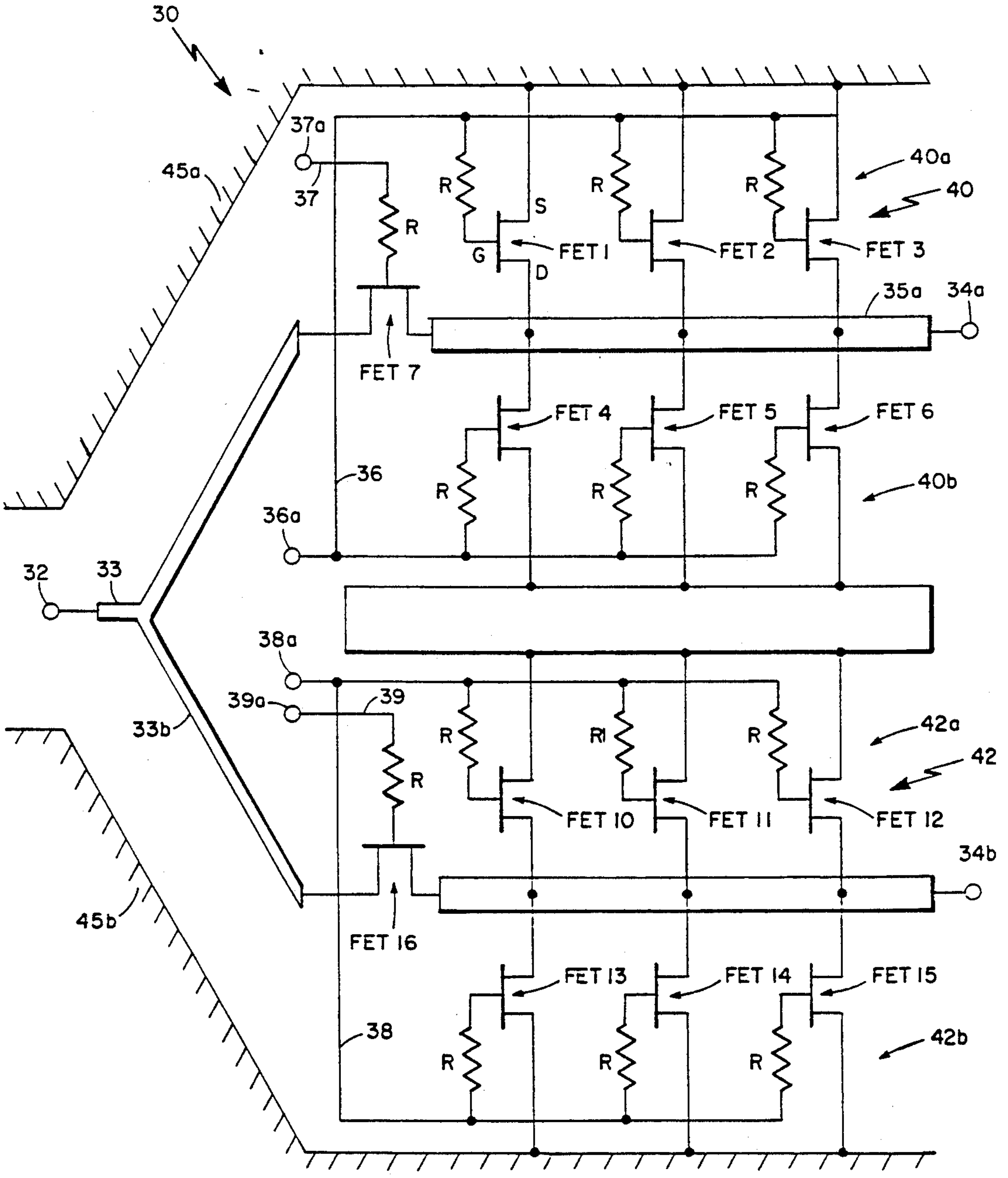
FIG. 4 is a schematic representation of a single-pole/-double-throw switch in accordance with a further aspect of the present invention.

Referring now to FIG. 4, a single-pole/double-throw switch 30, is shown to include a first path 40 including a first set 40a or plurality of FETs, here FET 1–FET 3 and a second set 40b or plurality of FETs, here FET 4–FET 6. Such sets 40a, 40b provide a first path for the switch 30. Respective pairs of such transistor FET 1, FET 4; FET 2, FET 5; and FET 3, FET 6 are coupled to a first propagation network 35a. Network 35a, here a microstrip transmission line has one end connected to a first branch terminal 34a of the circuit 30, and a second end connected to an common microstrip propagation network 33 having a branch 33a connected between a junction of line 33 and a series coupled FET 7, similar to FET 7 of FIG. 1. The input transmission line 33 has an end connected to a common terminal 32 of switch 30.

Thus, a first path for the switch 30 is provided between common terminal 32 and branch terminal 34a.

A second path 42, includes third and fourth pluralities of transistors 42a, 42b, that is, transistors FET 10–FET 12, and FET 13–FET 15, respectively, connected via a second propagation network 35b. Here a second series connected transistor FET 16 is disposed between propagation network 35b and a second branch portion 33b of common propagation network 33, and is thus coupled to the common terminal 32. A second one of the electrodes of FET 16 is connected to network 35b. Network 35b successively interconnects drain electrodes of each of the pairs of transistors FET 10, FET 13 and so forth, as shown. Thus a second path 42 is provided between common terminal 32 and second branch terminal 34b.

Source electrodes, of each one of said transistors, FET 1–FET 3 are coupled to a reference potential via a conductor 45a, as shown, whereas source electrodes of transistors FET 4–FET 6, and FET 10–FET 12 are coupled to a central conductor 46, as also shown. Source electrodes of transistors of FET 13–FET 15 are coupled to a third conductor 45b, as also shown. The gate electrode G of each one of the transistors FET 1–FET 6 is coupled through a respective pull-up resistor R and DC bias line 36 to a first control port 36a. A second control port 37a is coupled, via line 37 and resistor R, to the gate electrode of FET 7, as generally described in conjunction with FIG. 1. A similar arrangement is provided for channel 42, such that the third control terminal 38a is coupled, via line 38 and resistors R, to the gate electrodes G of FET 10–FET 15 and a fourth control terminal 39a is coupled via line 39 and resistor R to transistors FET 16.

Operation of switch 30 is generally similar to that described in conjunction with FIG. 1, and thus to couple a signal between terminal 32 and 34a and isolate terminal 34b, a control signal is fed to terminal 37a to place transistor FET 7 in a low impedance state and a second signal is fed to terminal 36a to place each of transistors FET 1–FET 6 in a high impedance state. Control signals are fed to terminals 38a and 39a to place transistor FET 16 in a high impedance state and transistors FET 10–FET 15 in low impedance states. In this mode, terminal 32 is substantially isolated from terminal 34b and terminal 32 is coupled to terminal 34a.

The opposite or compliment states of each one of the above control signals are thus fed to the control terminals 36a, 37a, 38a, and 39a to couple a signal between terminal 32 and 34b and isolate such signal from terminal 34a, as would now generally be appreciated by one of ordinarily skill in the art.

Figure 5:
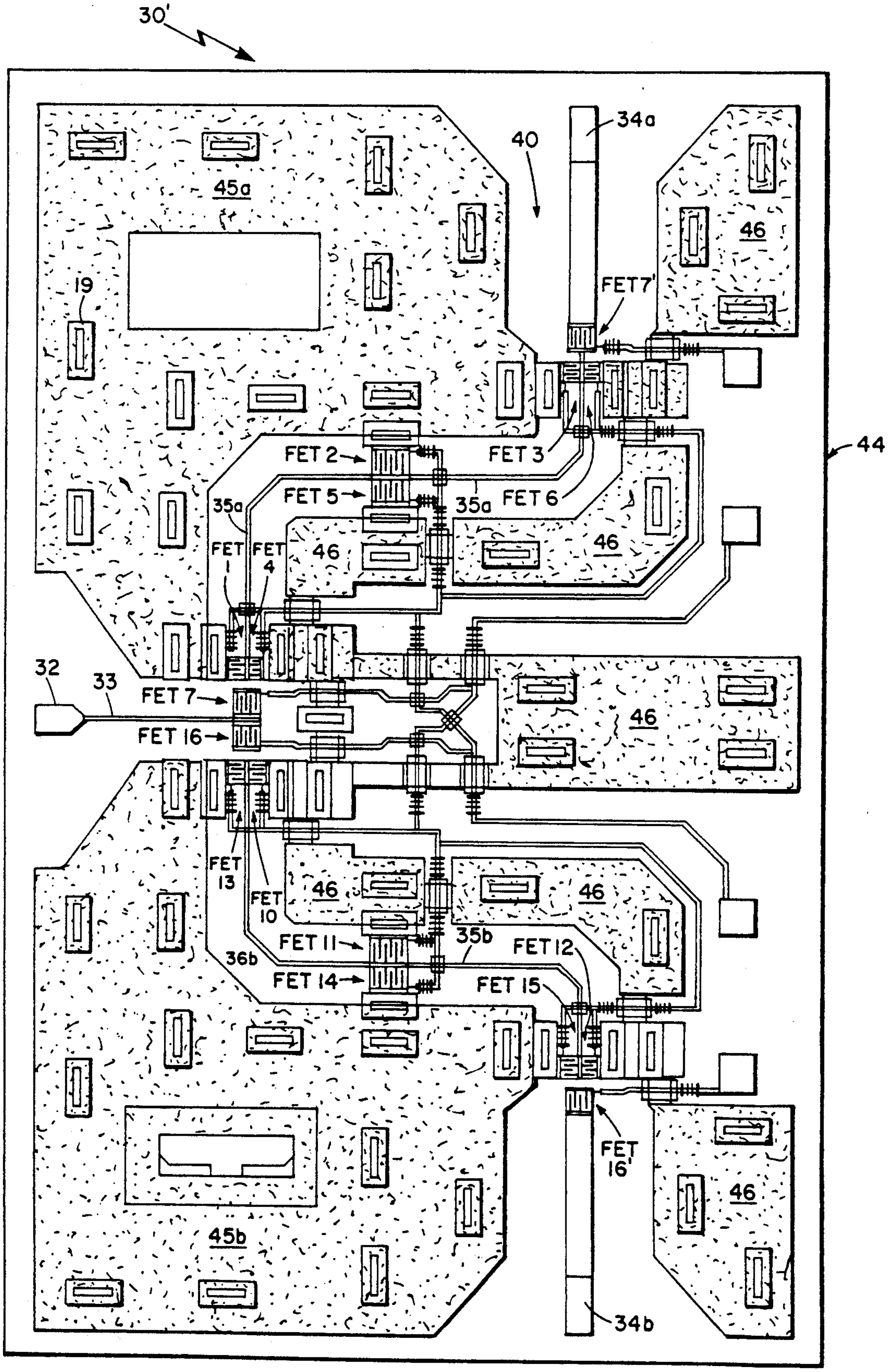
FIG. 5 is a plan view of the switch of FIG. 4 fabricated as a monolithic microwave integrated circuit.

Referring now to FIG. 5, a single-pole/double-throw switch 30 as generally described in conjunction with FIG. 4 is shown fabricated as a monolithic microwave integrated circuit 30′, using the general principles as discussed in conjunction with FIG. 2 for switch 10. Here, however, in addition to the elements as generally described in conjunction with FIG. 4, an extra pair of series connected transistors FET 7′ and FET 16′ are provided to connect the branch terminals 34a, 34b of the switch to the respective propagation network propagation lines 35a, 35b. Further branch lines 33a, 33b (FIG. 4) are not used in this embodiment. They are eliminated by bringing common propagation network 33 directly to the pair series coupled transistors FET 7, FET 16. Further details of construction for the device shown in FIG. 5 will now be apparent to one of ordinary skill in the art, particularly in light of the discussion of FIGS. 2 and 2A. Thus, suffice it here to say that a channelized microstrip transmission line 35a is provided by the plurality of symmetric shunt mounted FETS, FET 1, FET 4; FET 2, FET 5; and FET 3, FET 6, which are coupled or disposed between conductor areas 45a and 46, as shown. A similar arrangement is provided for channel 42. Other details of construction are generally described in conjunction with FIG. 2, and thus for the sake of brevity will not be repeated here. Conductors 45a, 45b, and 46 are coupled to an underlying ground plane conductor (not shown), supported by substrate 44, by via holes 19, as also described in conjunction with FIG. 2. The package as shown in FIG. 3 may also be used to package circuit 30. Here connectors 65a–65d feed the DC control signals to RF switch 30, whereas connectors 64a, 64c provide the branch ports for the switch 30 and connector 64b provides the common port for the switch 30. As also mentioned in conjunction with FIG. 1, switch 30 is provided with a plurality of pairs of shunt FETs, each one of such shunt FETs having a reactive impedance between a source and drain electrode thereof. This reactive impedance is taken into consideration when designing the propagation network 15 (FIG. 1) or 35a, 35b (FIG. 4) using distributed circuit principles, as is generally known, to provide broadband networks, and thus provide a switch having broadband characteristics including relatively high isolation.

Having described preferred embodiments of the invention, it will now become apparent to one of skill in the art that other embodiments incorporating these concepts may be used. For example, CAD routines may be used to optimize values of circuit components, such as the size of transistors. Meandering of the transmission line may be used to conserve space and other r.f. switch types may also be implemented. It is felt, therefore, that these embodiments should not be limited to disclosed embodiments, but rather should be limited only by the spirit and scope of the appended claims.

What is claimed is:

1. A radio frequency switch having a pair of terminals comprises:

a substrate, having disposed over a first surface thereof a reference conductor;

a pair of conductors disposed over a second opposite surface of said substrate and coupled to the reference conductor;

at least one pair of transistors, disposed on said second surface of said substrate between said pair of conductors, each one of said transistors having a control electrode, and first and second electrodes; and a propagation network disposed on said second surface of said substrate between said pair of conductors having a first end coupled to a first terminal of the switch, with first ones of said first and second electrodes of each one of the pair of transistors being connected to said network and with second ones of said first and second electrodes of the transistor being connected to a respective one of said pair of conductors.

2. The circuit as reciting claim 1, wherein the control electrode of each one of the pair of transistors is connected to a first control terminal of the switch.

3. The circuit as recited in claim 2, wherein said second one of said first and second electrodes of the pair of transistors coupled to a reference potential are coupled to ground.

4. The circuit as recited in claim 3, further comprising:

a third transistor having a control electrode coupled to a control second terminal of the switch circuit, and first and second electrodes, with a first one of said first and second electrodes being coupled to a second one of said terminals of the switch, and a second one of said first and second electrodes being coupled to the propagation network.

5. The circuit as recited in claim 4, wherein each one of said conductors disposed over the second opposite surface are coupled to the ground plane conductor disposed over the first surface of the substrate by a plurality of plated vias disposed through said substrate.

6. A radio frequency switch having a pair of terminal comprising:

a substrate having disposed over a first surface thereof a ground plate conductor;

a pair of conductors coupled to said ground plane conductor and disposed over a second surface of the substrate;

a plurality of pairs of transistors each one of said transistors in each pair having a control electrode, and first and second electrodes, with said transistors being disposed on said substrate between said pair of conductors and with first transistors of each of the pairs of transistors having a first electrode coupled to a first one of said pair of conductors and second transistors of each one of the pair of transistors having a first electrode coupled to the second one of the pair of conductors; and a strip conductor disposed on said substrate between first transistors and second transistors of the plurality of pairs of transistors with the second electrode of said transistors being coupled to the strip conductor.

7. The switch, as recited in claim 6, further comprising a transistor having a control electrode, and first and second electrode with the first one of said first and second electrodes being coupled to one of the terminals of the switch and a second one of said first and second electrodes being coupled to the strip conductor.

8. The circuit, as recited in claim 7, wherein the control electrode of each one of the pair of transistors is connected to a first control terminal and the control electrode of the transistor is connected to a second different control terminal of the switch.

9. The circuit, as recited in claim 8, wherein each one of the said pair of conductors disposed over the second surface of the substrate is coupled to the reference conductor disposed over the first surface of the substrate by a plurality of plated vias disposed through said substrate.

* * * * *

US005023494A

REEXAMINATION CERTIFICATE (1828th)

United States Patent [19]

[11] B1 5,023,494

Tsukii et al.

[45] Certificate Issued Oct. 27, 1992

[54] HIGH ISOLATION PASSIVE SWITCH

[75] Inventors: Toshikazu Tsukii, Santa Barbara; S. Gene Houng; Michael D. Miller, both of Goleta; Sherwood A. McOwen, Jr., Santa Barbara, all of Calif.

[73] Assignee: Raytheon Company, Lexington, Mass.

Reexamination Request:
No. 90/002,591, Feb. 19, 1992

Reexamination Certificate for:

| | |
|---|---|
| Patent No.: | **5,023,494** |
| Issued: | **Jun. 11, 1991** |
| Appl. No.: | **424,773** |
| Filed: | **Oct. 20, 1989** |

[51] Int. Cl.$^5$ ..................... H03K 3/013; H03K 17/08; H03K 17/687; H01P 1/15

[52] U.S. Cl. ................................ 307/571; 307/303.2; 307/482.1; 307/542; 307/594; 307/596; 333/262

[58] Field of Search .................. 307/571, 303.2, 482.1; 333/262, 103, 104

[56] References Cited

U.S. PATENT DOCUMENTS 4,556,808 12/1985 Coats .................................. 307/571

*Primary Examiner*—David R. Hudspeth

[57] ABSTRACT

A radio frequency switch disposed over a substrate having ground plane conductors disposed over an opposite surface thereof is described. The switch has at least two terminals, and includes a plurality of pairs of transistors, each one of said transistors coupled between a reference potential and a common transmission line which is coupled to one of the pair of terminals. A pair of topside conductors are disposed over the substrate to couple the transistors through plated vias to a bottom ground plane conductor. The switch further includes a series connected transistor disposed between the r.f. line and a second one of the terminals of the circuit.

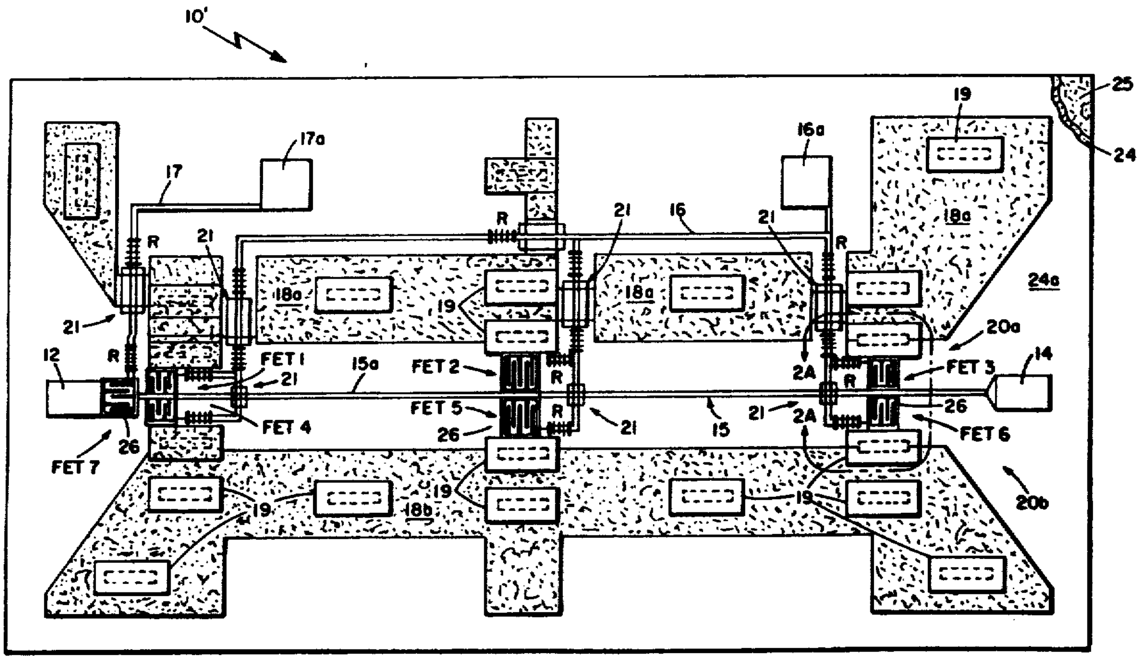

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-9 is confirmed.

* * * * *